United States Patent [19]
Ker

[11] Patent Number: 6,075,686
[45] Date of Patent: Jun. 13, 2000

[54] ESD PROTECTION CIRCUIT FOR MIXED MODE INTEGRATED CIRCUITS WITH SEPARATED POWER PINS

[75] Inventor: Ming-Dou Ker, Hsinchu, Taiwan

[73] Assignee: Industrial Technology Research Institute, Hsinchu, Taiwan

[21] Appl. No.: 08/890,660

[22] Filed: Jul. 9, 1997

[51] Int. Cl.[7] .................................................. H02H 9/00
[52] U.S. Cl. ................................................................ 361/56
[58] Field of Search ............................... 361/18, 56, 111, 361/119, 91.1, 91.5

[56] References Cited

U.S. PATENT DOCUMENTS

| 4,855,863 | 8/1989 | Yoshitake | 361/56 |
| 5,530,612 | 6/1996 | Maloney | 361/56 |
| 6,002,568 | 12/1999 | Ker et al. | 361/111 |
| 6,011,681 | 1/2000 | Ker et al. | 361/111 |

Primary Examiner—Ronald W. Leja
Attorney, Agent, or Firm—Proskauer Rose LLP

[57] ABSTRACT

An ESD protected circuit is provided for protecting first and second internal circuits against ESD failure. The first and second internal circuits are respectively connected to either a first or a second power supply bus. The first and second power supply busses are mutually isolated from each other and are of the same polarity. The ESD protected circuit includes a first ESD protection circuit connected to the first power supply bus. A second ESD protection circuit is also provided which is connected to the second power supply bus. A third ESD protection circuit is connected between the first and second power supply busses. The third ESD protection circuit is for selectively connecting the first and second power supply busses only during an ESD event so that ESD energy applied to one of the first or second power supply busses couples to a second one of the first or second power supply busses. ESD energy coupled between the first and second power supply busses is also coupled through at least one of the first or second ESD protection circuits to ground.

9 Claims, 13 Drawing Sheets

PS-mode

NS-mode

PD-mode

ND-mode

Positive-mode

Negative-mode

Positive-mode

Negative-mode

ESD PROTECTION CIRCUIT FOR MIXED MODE INTEGRATED CIRCUITS WITH SEPARATED POWER PINS

FIELD OF THE INVENTION

The present invention pertains to electrostatic discharge (ESD) protection of integrated circuits (IC's).

BACKGROUND OF THE INVENTION

With the advancement of IC integration technology, analog circuits have been incorporated into digital IC's thereby increasing the functions provided by the IC's. An IC with both analog and digital circuits is referred to as "mixed-mode" IC. The analog circuits of the IC often need "clean" power supplies to provide critical circuit performance. Unfortunately, the high-speed switching operation of the logic transitions in the digital circuits of the IC often introduces transient noise on the low (VSS) and high (VDD) voltage power supply busses. This noise generated by the digital circuits can cause the analog circuits of the IC to malfunction or to function with degraded performance. To overcome the noise issue, separate, mutually isolated power supply busses are provided for the analog and digital circuits in mixed-mode IC's. By using separate power supplies and busses for the analog and digital circuits, the noise-coupling effect through the power supply busses is greatly reduced. However, the separated power supply busses cause a new ESD failure as described below.

There are three ESD failure scenarios used to test IC architectures. The schematic circuit diagrams showing the three ESD scenarios are illustrated in FIG. 1, FIG. 2, and FIG. 3. The scenario of FIG. 1 has four of ESD stress modes on IC pins for which testing may be performed. In each mode, a positive or negative ESD voltage applied to a pin with either the VSS pin or the VDD pin grounded. In the ESD-stress scenario of FIG. 1, the ESD protection design for the input or output pins must accommodate the ESD current discharging path of the four modes of ESD stresses. The prior art has proposed numerous suitable ESD protection architectures for protection against the ESD scenario of FIG. 1 for ordinary digital IC's.

FIG. 2 shows a different ESD stress scenario. The positive or negative ESD voltages are applied to an input or output pin with the other input and output pins grounded, and the VDD and VSS pins left floating. This "pin-to-pin" ESD test scenario often causes some unexpected ESD damage to the internal circuits beyond the input or output ESD protection circuits (provided to protect against the scenario shown in FIG. 1).

In the scenario shown in FIG. 3, the ESD voltages are applied directly across the VDD and VSS pins of an IC. Thus, this scenario tests the IC's resistance to VDD-to-VSS ESD stresses. In the VDD-to-VSS ESD test scenario, the positive or negative ESD voltages are applied to the VDD pin with the VSS pin relatively grounded, and with all the input and output pins left floating. This VDD-to-VSS ESD test scenario often causes some unexpected ESD damage to the internal circuits beyond the input or output ESD protection circuits.

To protect the CMOS IC's against the ESD stresses shown in the scenarios of FIGS. 2 and 3, additional ESD protection circuits are generally added to the input and output pins. Specifically, to avoid the unexpected ESD damage to the internal circuits beyond the ESD protection circuits, an additional ESD clamp device is added between the VDD and VSS power supply busses of the IC's. A typical ESD clamp device in the CMOS IC's is the gate-grounded NMOS device. The operation principle of the ESD clamp device between the VDD and VSS power lines in the pin-to-pin ESD stress condition is illustrated in FIG. 4.

As shown in FIG. 4, a positive ESD voltage is applied to an input pin (and therefore to input pad 12) with an output pin (and therefore output pad 14) relatively grounded. The VDD and VSS pads 16 and 18 are left floating. As a result of being allowed to float, the ESD current is first transferred into the floating VDD power supply bus 20 through the diode Dp1 of the input ESD protection circuit 24. Because the output pad 14 is grounded, the floating VSS power supply bus 22 is biased at a voltage level near ground through the parasitic diode Dn2 in the NMOS FET 25 of the output buffer/driver 23. The ESD voltage across the VDD and VSS power supply busses 20, 22 may cause ESD energy (current/voltage) to discharge through the internal circuits 28 of the IC. Because the devices in the internal circuits 28 are often designed and drawn with the minimum device dimension to conserve silicon area of the IC, such ESD energy can damage the internal circuits 28. To protect against this ESD stress, the VDD-to-VSS ESD clamp device 26 is added between the VDD and VSS power supply busses 20, 22. In FIG. 4, the ESD protection clamp 26 is in the form of a gate-grounded NMOS FET connected between the VDD and VSS power supply busses 20, 22. When the ESD stress, due to the pin-to-pin ESD stress of FIG. 2 or the direct VDD-to-VSS ESD stress of FIG. 3, is applied across the VDD and VSS power supply busses 20, 22, the gate-grounded NMOS FET 26 breaks down to clamp the ESD voltage across the power supply busses 20, 22 and to bypass the ESD current away from the internal circuits 28. The dashed lines in FIG. 4 show the ESD current discharging. Therefore, the digital internal circuits of a digital only IC can be protected against the ESD stress.

Consider now the above-described ESD protection architecture in a mixed-mode IC. FIG. 5 illustrates the pin-to-pin ESD stress induced failure in a mixed-mode IC. As before, high voltage VDD and low voltage VSS power supply busses 42, 44 are connected to a digital internal circuit 46. However, separate high voltage VDDA and low voltage VSSA power supply busses 38, 40 are connected to an analog internal circuit 34. The VDD and VDDA busses 42 and 38 are mutually isolated from each other and the VSS and VSSA busses 44 and 40 are mutually isolated from each other. Analog and digital interface circuits (inverters) 48 and 50 enable transfer of a signal from the analog internal circuit 34 to the digital internal circuit 46 yet isolate the two internal circuits 34 and 46 so that noise does not couple between the internal circuits 34 and 46. Diodes Dn1 and Dp1 form an ESD protection circuit 24 for the VDD and VSS busses 42 and 44. Diodes Dp2 and Dn2 form an ESD protection circuit 24' for the VDD and VSSA busses 38 and 40.

In FIG. 5, a positive ESD voltage is applied to an input pad 32 of the analog internal circuit 34 while a digital input pad 36 is relatively grounded and both the analog and digital power supply busses VDDA, VSSA, VDD, VSS 38, 40, 42 and 44 are left floating. Because the digital input pad 36 is grounded, the p-substrate of the mixed-mode IC is initially biased at a voltage level near ground through the diode Dn1. The p-substrate is common for both the digital and analog internal circuits 34 and 46 in a mixed-mode IC. As such, the VSSA power supply bus 40 is also biased at a voltage level near ground through the substrate resistor Rsub. A positive ESD voltage applied to the analog input pad 36 is coupled to the floating VDDA power supply bus 38 by the diode Dp2 in the analog input ESD protection circuit 24'. Because the VSSA power supply bus 40 initially is biased at a low voltage level, the gate of PMOS FET Mp3 of interface circuit 48 is biased at a low voltage level through a parasitic diode Dn4 in the analog internal circuit 34. The ESD charged VDDA power supply bus 38 biases the analog inverter 48 and causes PMOS FET Mp3 to turn on. As a result, the ESD current of the VDDA power supply bus 38 is diverted through Mp3 to the node B between the digital and analog inverters 50 and 48.

Because the digital input pad 36 is grounded, the VDD power supply bus 42 is also initially biased at a low voltage level through the diode Dp1 in the digital input ESD protection circuit 24. The ESD voltage applied to the node B, and the near ground voltages applied to the digital VDD and VSS power supply busses 42 and 44 induce an ESD stress across the gate oxides of the digital inverter 50. This causes the ESD failure to occur at the digital-analog interface circuits 48 and 50. Such ESD failures located at the digital-analog interface circuits 48 and 50 are difficult to identify and can not be observed by only inspecting the leakage current on either the digital and analog input pads 32 and 36 or the VDD, VSS, VDDA or VSSA power supply busses 38, 40, 42 or 44. In other words, full IC function testing, especially testing of the interface functions between the analog and digital circuits 34 and 46, must be performed to locate such an ESD failure. As such, more complex testing technologies must be used in order to detect such ESD damage of the analog-digital interface circuits 48 and 50.

FIG. 6 shows a similar scenario, where the pin-to-pin ESD stress is a positive ESD voltage applied to the digital input pad 36 with the analog input pad 32 relatively grounded, and all the digital and analog VDD, VSS, VDDA and VSSA power supply busses 38, 40, 42 and 44 left floating. As a result of grounding the analog input pad 32, the analog VDDA and VSSA power supply busses 38 and 40 are biased at a voltage level near ground through the diodes Dp2 and Dn2 in the analog input ESD protection circuit 24'. The positive ESD voltage applied to the digital input pad 36 is coupled to the digital VDD power supply bus 42 through the diode Dp1 in the digital input ESD protection circuit 24. Because the VSSA power supply bus 40 is connected to the p-substrate of the mixed-mode IC, the VSS power supply bus 44 is biased at a low voltage level near ground through the substrate resistor Rsub. The VSS power supply bus 44 biases the gate of the PMOS FET Mp1 in the digital inverter 50 through a parasitic diode Dn6 of the digital internal circuit 46. Because the VDD power supply bus 42 is charged by the ESD energy to a positive voltage level, the PMOS FET Mp1 turns on and conducts the ESD current to the node A on the interface line between the digital and analog interface circuits 48 and 50. An ESD voltage is thus applied between node A and the VDDA and VSSA power supply busses 38, 40, i.e, across the gate oxides of the PMOS FET Mp3 and the NMOS FET Mn3 of the inverter 48. As a result, the gate oxides of the PMOS FET Mp3 and NMOS FET Mn3 in the analog inverter 48 may be damaged by the ESD stress.

In a similar fashion, a VDD-to-VSS ESD stress scenario can also damage the interface circuits 48 and 50.

FIG. 7 shows a prior art ESD protection architecture for preventing damage to the interface circuits of a mixed mode IC. In FIG. 7, ESD protection circuits 54, 56 and 58 are added to protect the interface inverters 48 and 50. Specifically, ESD protection circuit 54 includes a PMOS FET Mp4 connected between the interface line 52 and the VDDA power supply bus 38. The gate of the PMOS FET Mp4 is connected to the VDDA power supply bus 38. Likewise, an NMOS FET Mn4 is a connected between the interface line 52 and the VSSA power supply bus 40. The gate of the NMOS FET Mn4 is connected to the VSSA power supply bus 40. The ESD protection circuit 56 includes NMOS FET Mn6 connected as an ESD clamp circuit between the VDD and VSS power supply busses 42 and 44. The ESD protection circuit includes the NMOS FET Mn7 connected as an ESD clamp circuit between the VDDA and VSSA power supply busses 38 and 40. In a pin-to-pin or VDD-to-VSS ESD stress scenario, the ESD voltage across the gate oxides of the interface circuits 48 or 50 is clamped by the ESD protection circuit 54. Therefore, the gate oxides of the interface circuits can be protected against the ESD failure. The problem with the architecture shown in FIG. 7 is that the number of interface lines 52 and interfaces 50 and 48 may be great. Furthermore, the interface lines 52 may be connected in a complex fashion, e.g., one analog interface 48 may be connected to many digital interfaces 50 or vice versa. As such, the architecture of FIG. 7 may be difficult to realize in complex analog-digital interface architectures.

FIG. 8 shows a second prior art solution for preventing ESD failure at the digital-analog interface circuits 48 and 50. In the architecture of FIG. 8, an ESD protection circuit 60 is provided instead of the ESD protection circuit 54. The ESD protection circuit 60 includes an NMOS FET Mn8 connected between opposite polarity VDD and VSSA power supply busses 42 and 40 and an NMOS FET Mn9 connected between opposite polarity VDDA and VSS power supply busses 38 and 44. The gate of Mn8 is connected to the VSSA power supply bus 40 and the gate of Mn9 is connected to the VSS power supply bus 44. If an ESD voltage is applied across the VDD and VSSA power supply busses 42 and 40, the ESD voltage is clamped by Mn8. Likewise, if an ESD voltage is applied across the VDDA and VSS power supply busses and 44, the ESD voltage is clamped by Mn9. Such an architecture does reduce the likelihood of ESD failures at the digital-analog interface circuits 48 and 50. To provide effective ESD protection between the power supply busses 38–44, the NMOS FETs Mn8 and Mn9 are often drawn with large dimensions and the power supply busses 38–44 connected to Mn8 and Mn9 must be made wider in order to quickly bypass the large ESD-transient current. This is undesirable because a large amount of precious IC area must be allocated to ESD protection.

It is an object of the present invention to overcome the disadvantages of the prior art.

SUMMARY OF THE INVENTION

This and other objects are achieved according to the present invention. According to an embodiment, an ESD protected circuit is provided for protecting first and second internal circuits against ESD failure. The first and second internal circuits are respectively connected to either a first or a second power supply bus. The first and second power supply busses are mutually isolated from each other and are of the same polarity. The ESD protected circuit includes a first ESD protection circuit connected to the first power supply bus. A second ESD protection circuit is also provided which is connected to the second power supply bus. A third ESD protection circuit is connected between the first and second power supply busses. The third ESD protection circuit is for selectively connecting the first and second power supply busses only during an ESD event so that ESD energy applied to one of the first or second power supply busses couples to a second one of the first or second power supply busses. ESD energy coupled between the first and second power supply busses is also coupled through at least one of the first or second ESD protection circuits to ground.

DETAILED DESCRIPTION OF THE INVENTION

Figure 1A:
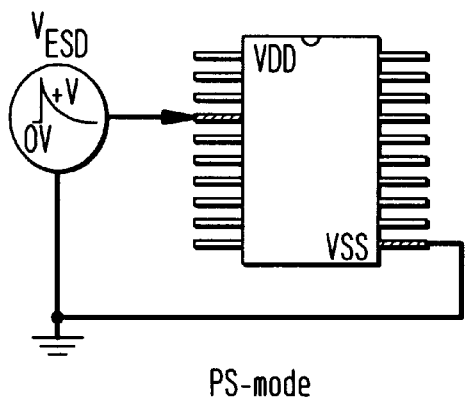
FIGS. 1–3 show conventional ESD test stress scenarios.
Figure 1B:
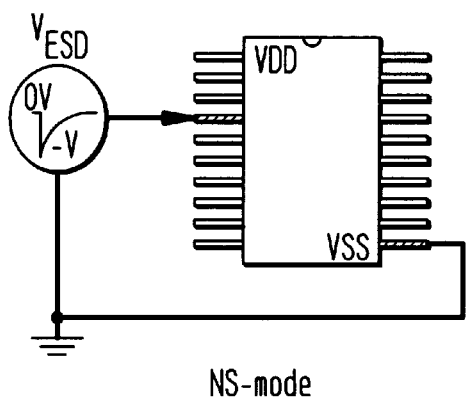
Figure 1C:
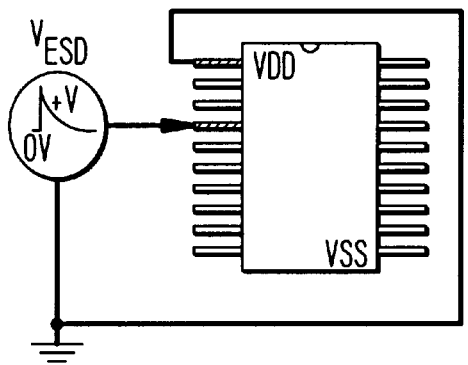
Figure 1D:
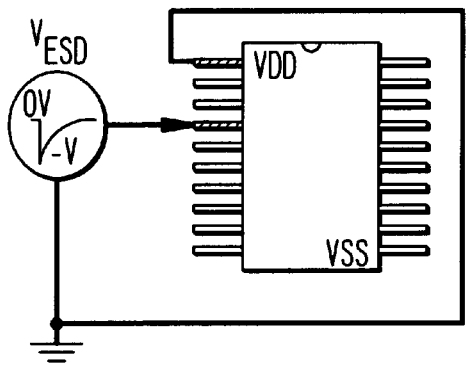
Figure 2A:
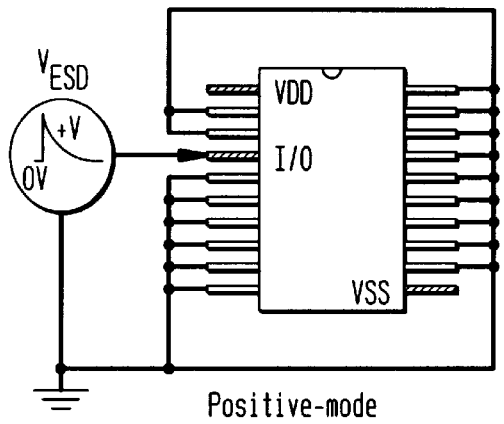
Figure 2B:
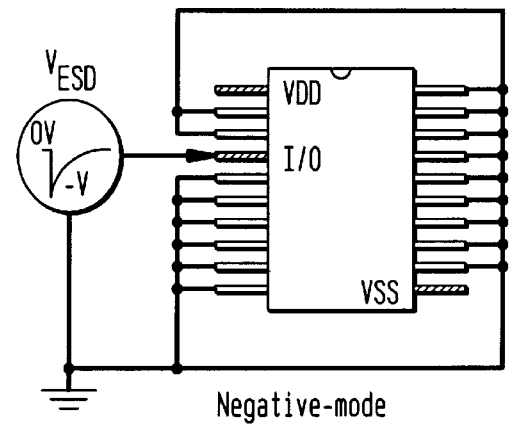
Figure 3A:
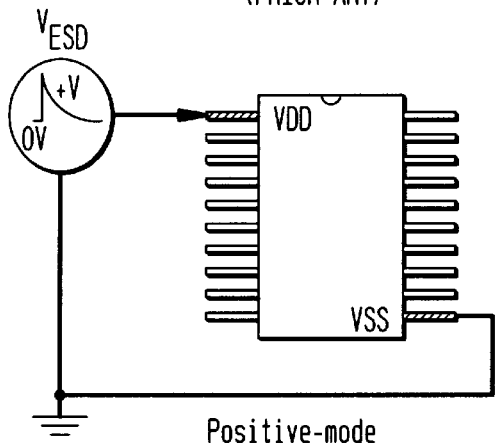
Figure 3B:
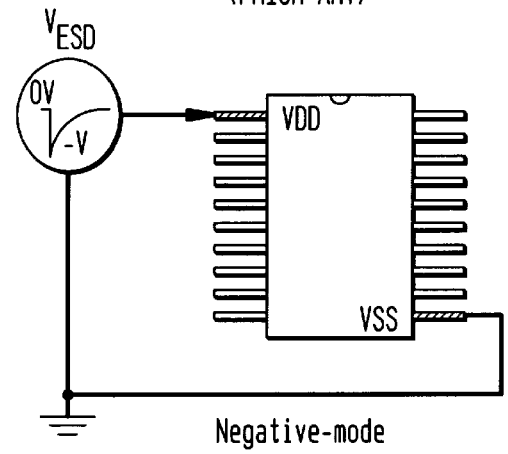
Figure 4:
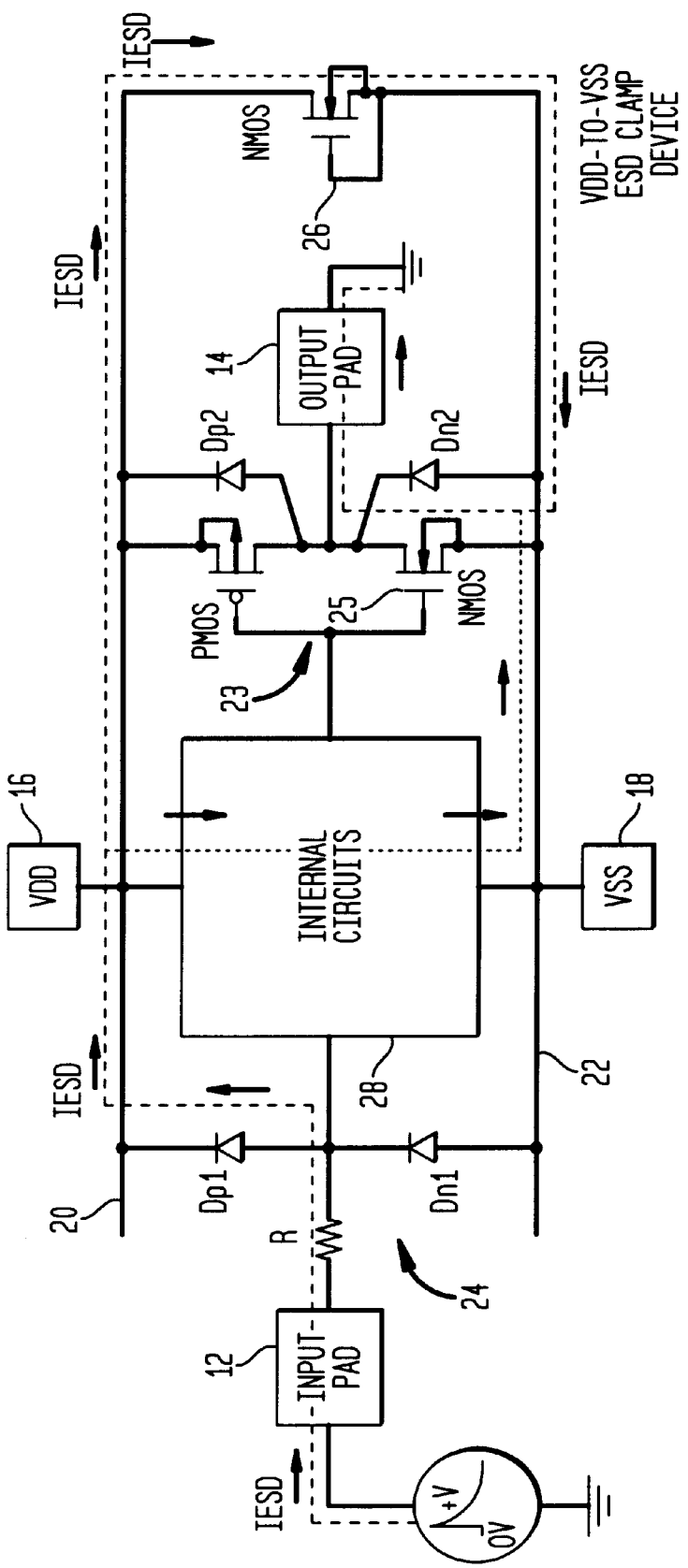
FIG. 4 shows a conventional ESD protected circuit.
Figure 5:
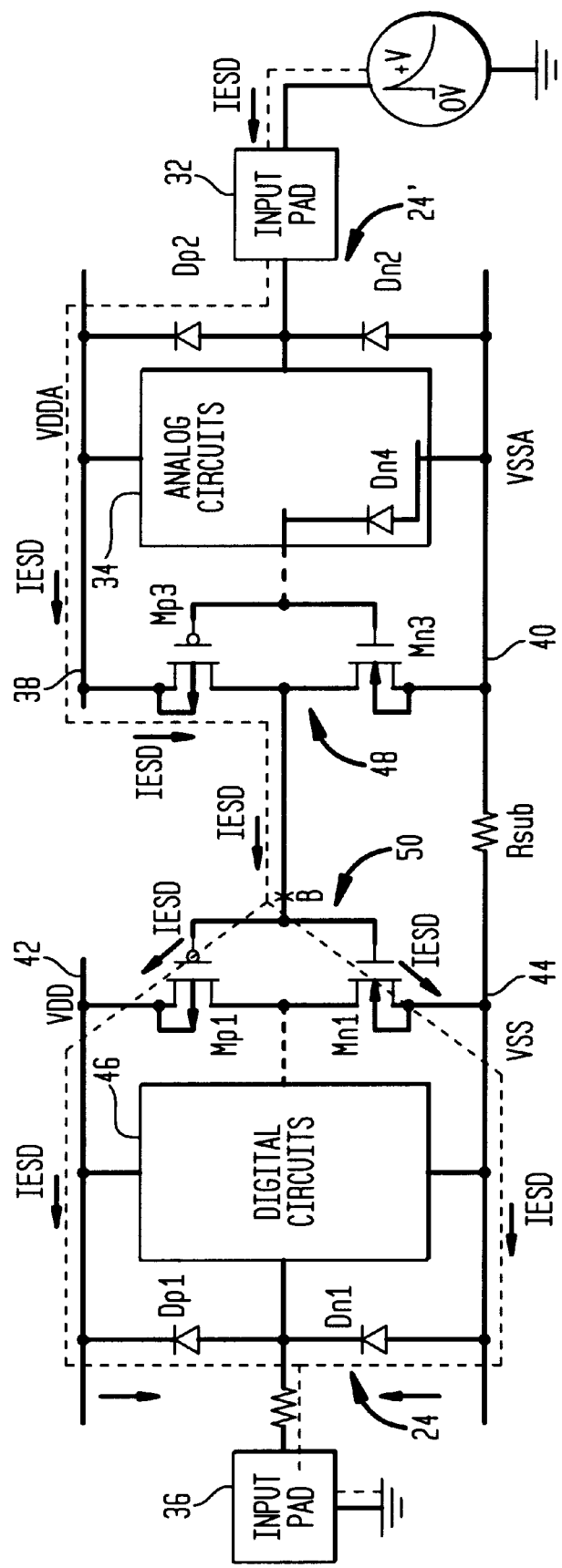
FIGS. 5–6 show an ESD failure in a mixed-mode IC.
Figure 6:
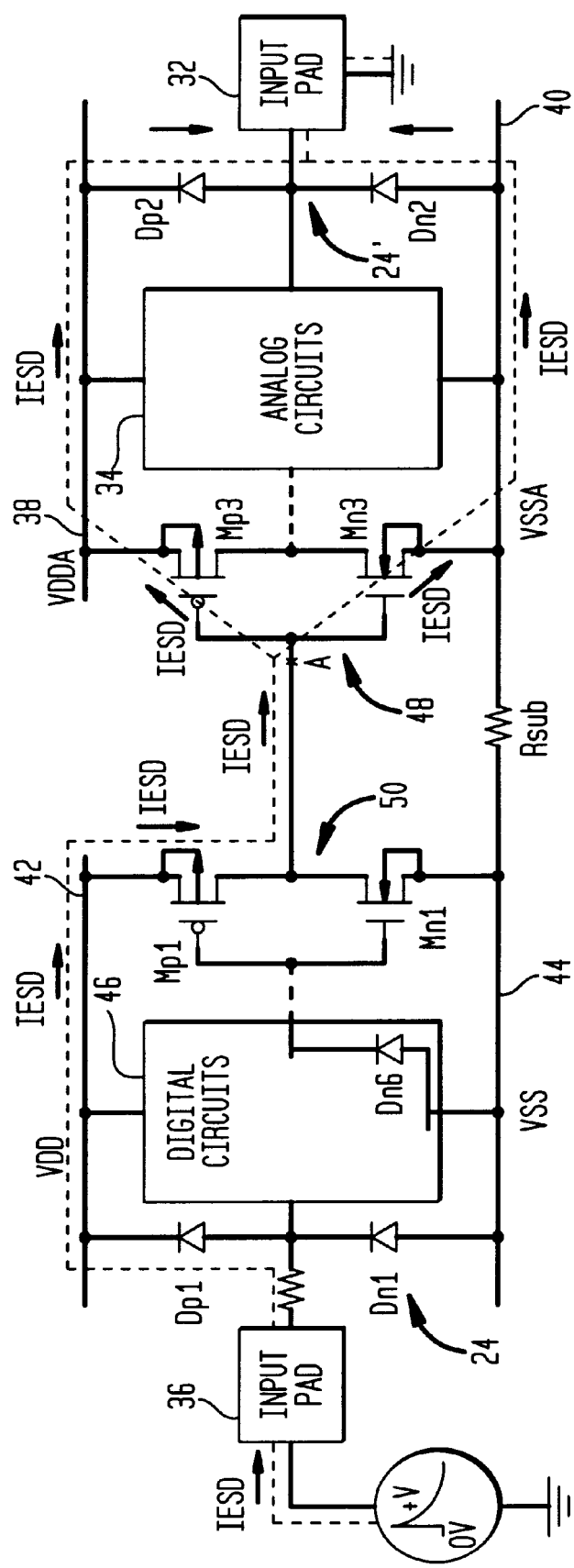
Figure 7:
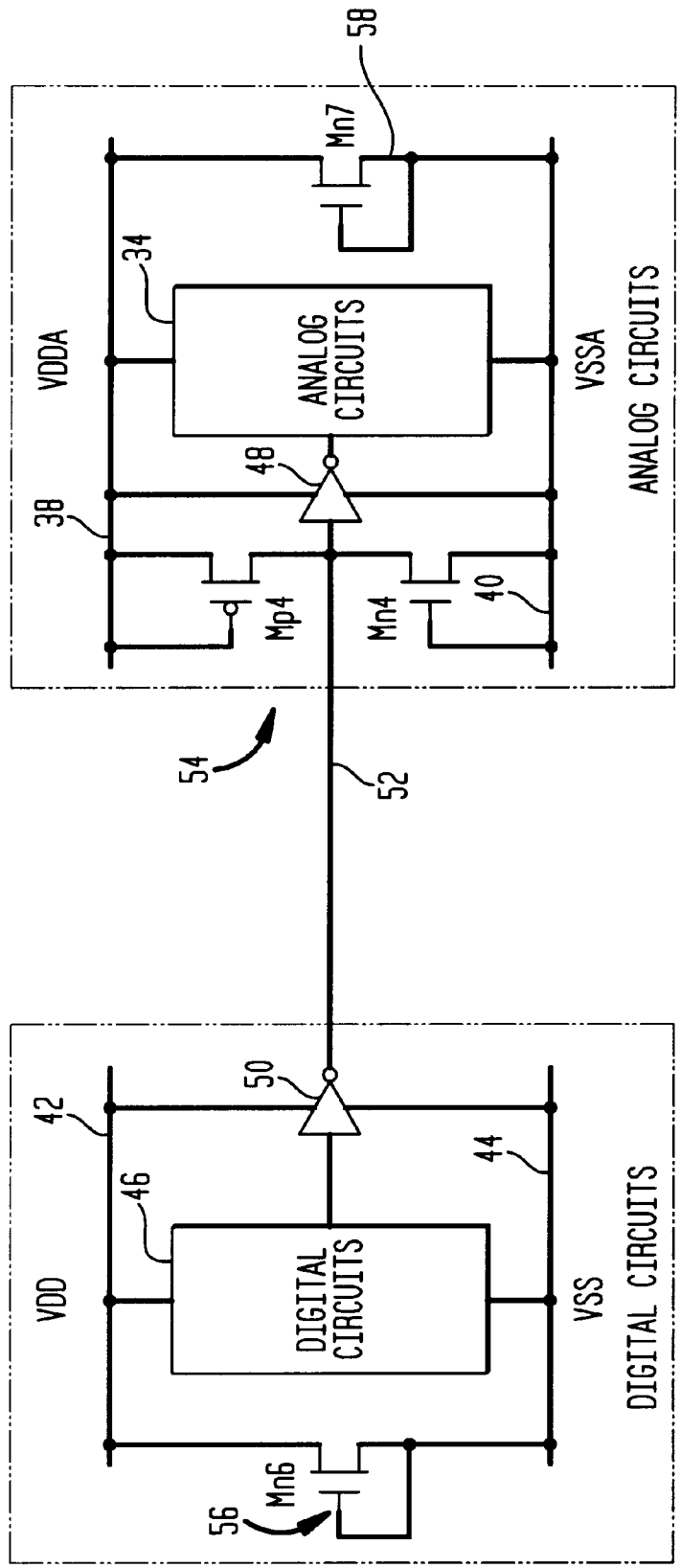
FIG. 7 shows a first conventional ESD protected mixed-mode IC.
Figure 8:
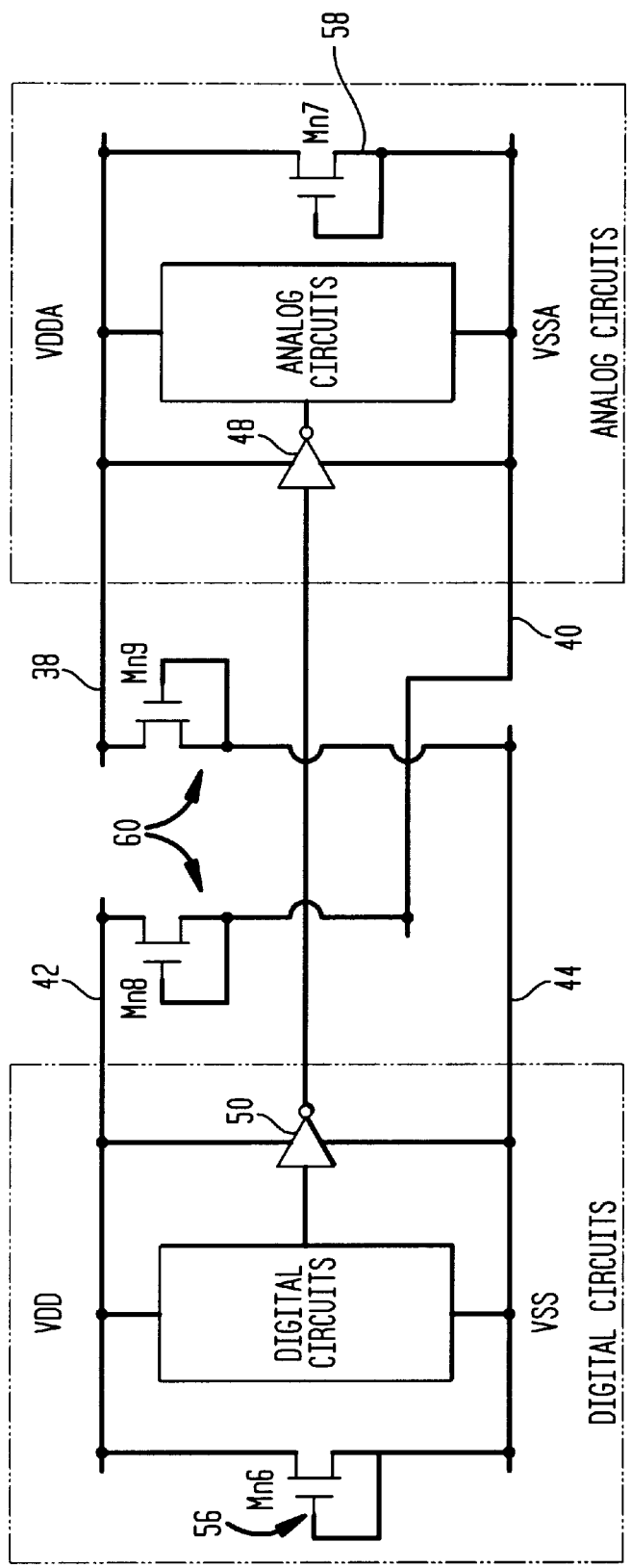
FIG. 8 shows a second conventional ESD protected mixed-mode IC.
Figure 9:
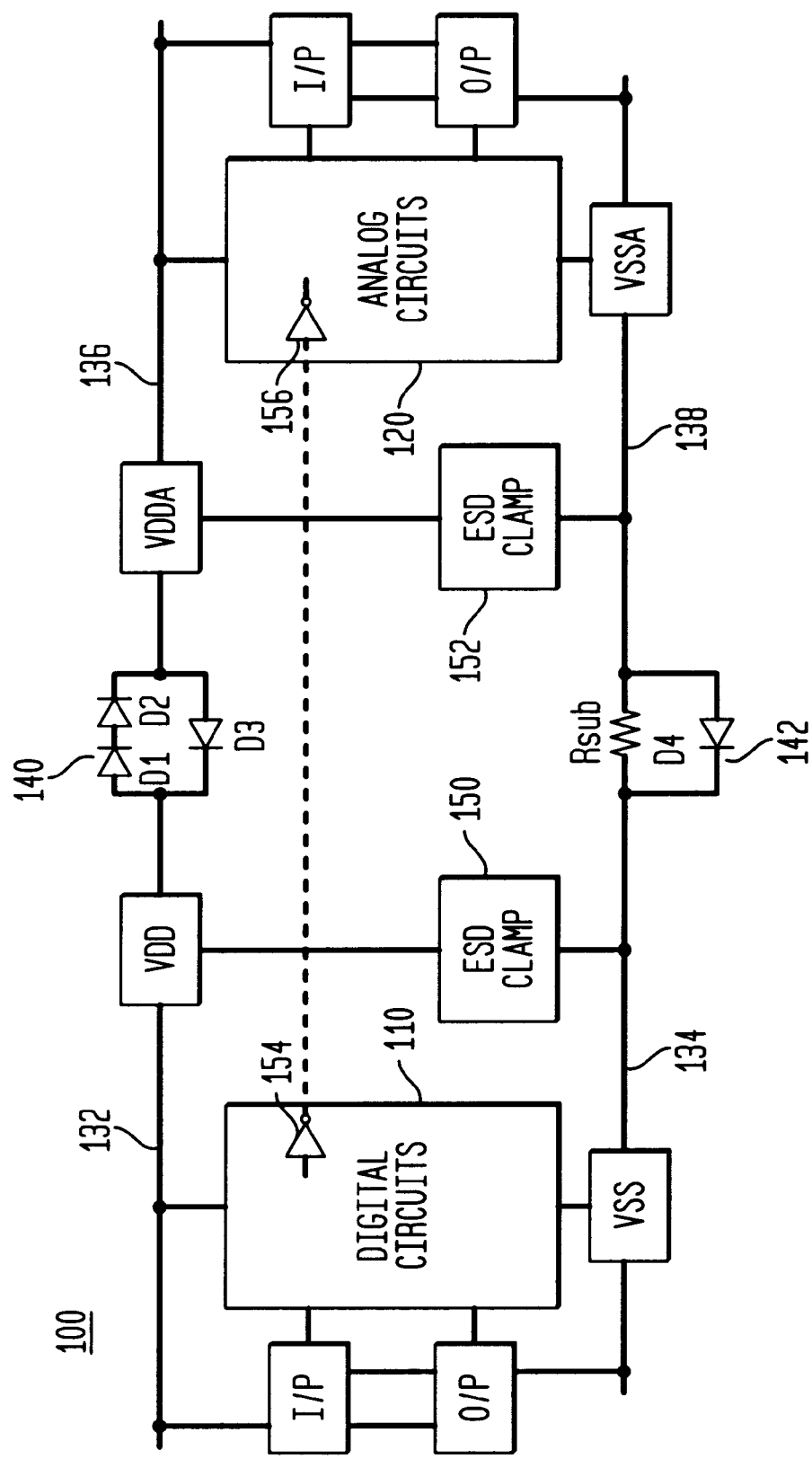
FIG. 9 shows an ESD protected mixed-mode IC according to a first embodiment of the present invention.

FIG. 9 shows an ESD protected mixed-mode IC 100 according to an embodiment of the present invention. The mixed-mode IC has a first internal circuit 110 and a second internal circuit 120. Illustratively, the first internal circuit 110 is a digital circuit and the second internal circuit is analog circuit. The first internal circuit 110 is connected to VDD power supply bus 132 and VSS power supply bus 134. The second internal circuit 120 is connected to VDDA power supply bus 136 and VSSA power supply bus 138. The VDD and VDDA power supply busses are of the same polarity (i.e., high voltage) but are isolated from each other so as to reduce the coupling of noise between the two busses 132 and 136. Likewise, the VSS and VSSA power supply busses are of the same polarity (i.e., low voltage) but are isolated from each other so as to reduce the coupling of noise. An ESD protection circuit 150 is connected between the VDD and VSS power supply busses 132 and 134. An ESD protection circuit 152 is connected between the VDDA and VSSA power supply busses 136 and 138. Interface circuits 154, 156 are provided between the internal circuits 110 and 120 for transferring signals between the two circuits 110, 120.

Figure 11:
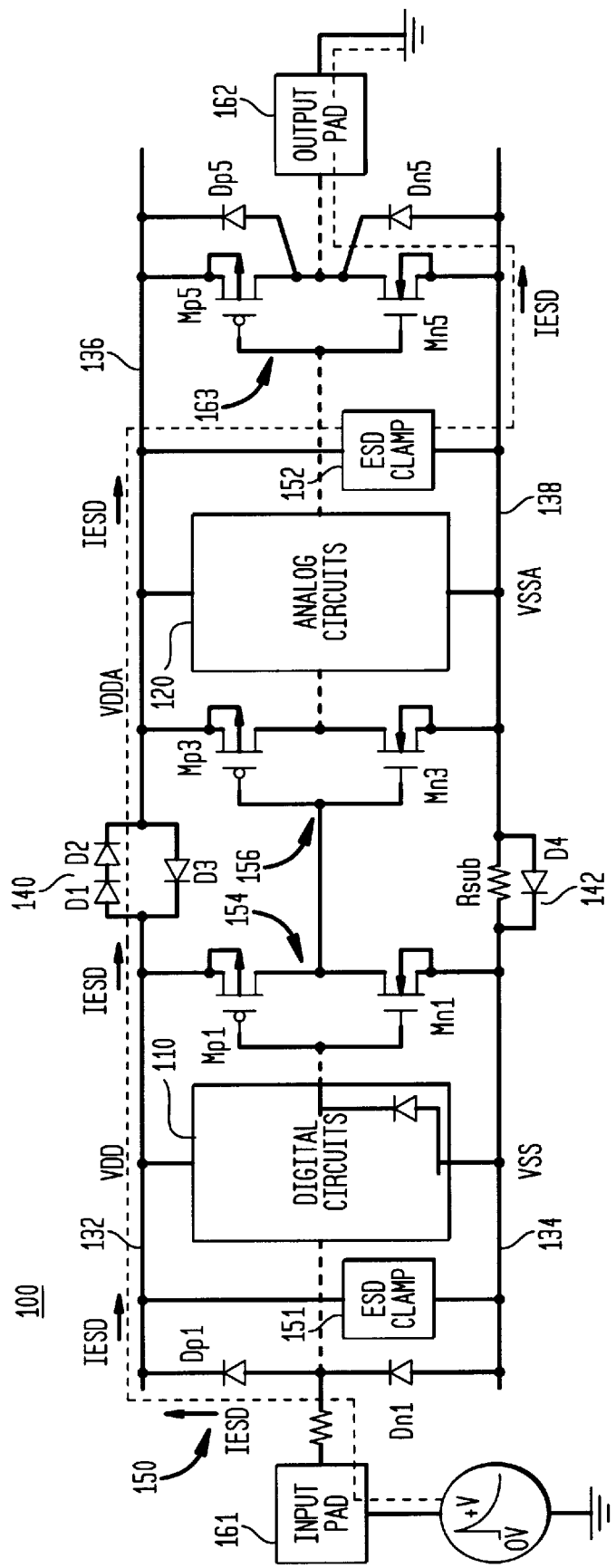
Figure 12:
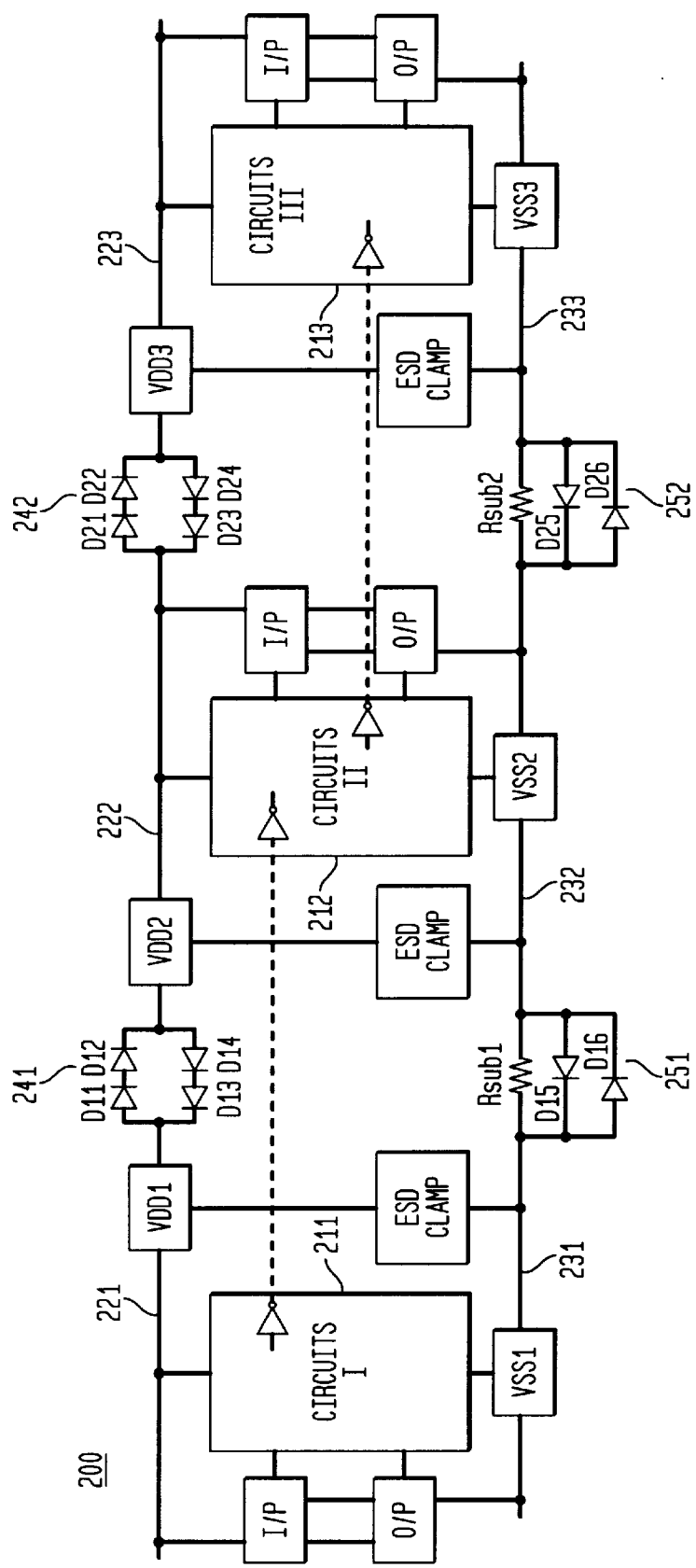
FIG. 12 shows an ESD protected mixed-mode IC according to a second embodiment of the present invention.
Figure 13:
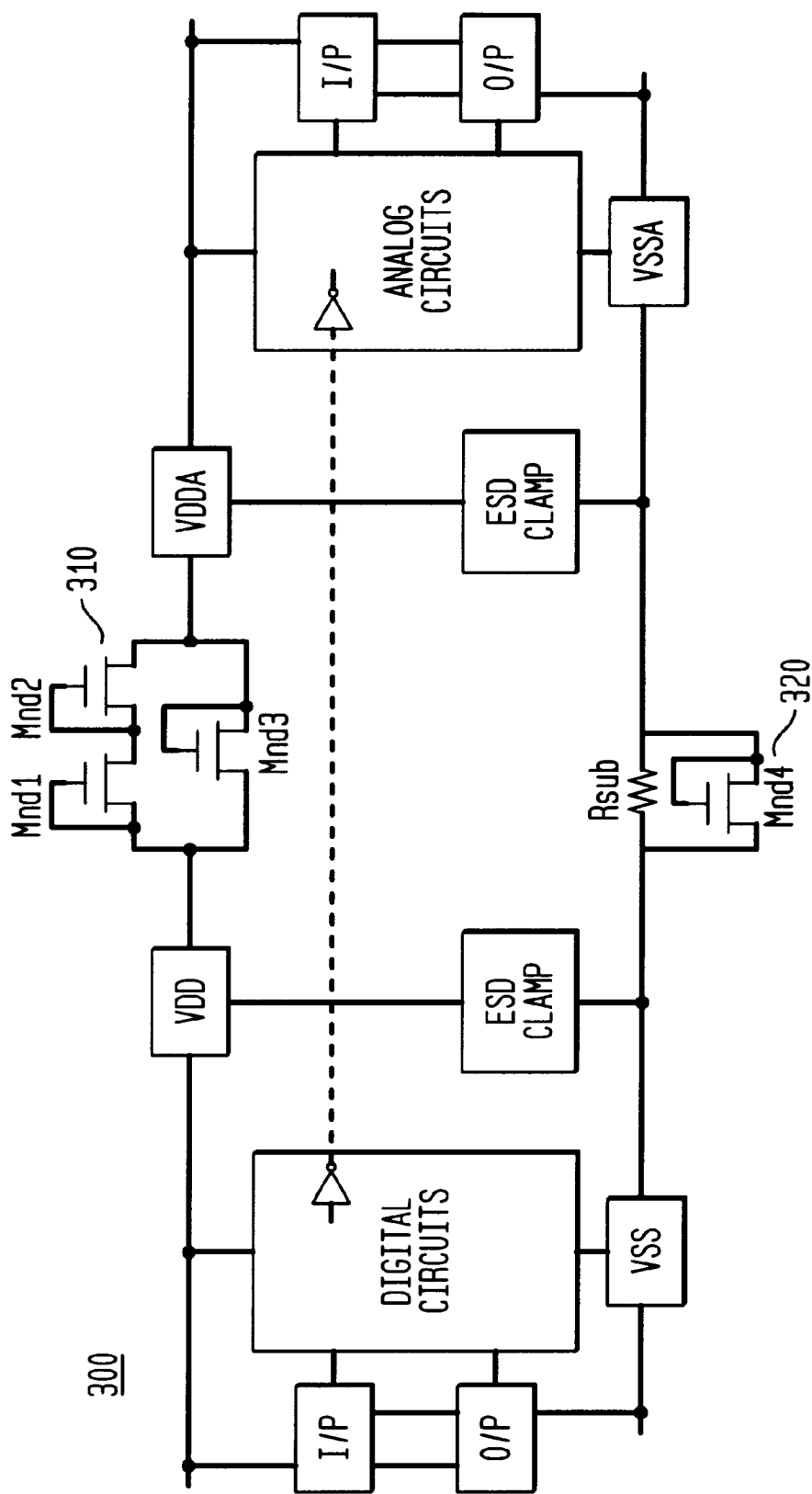
FIG. 13 shows an ESD protected mixed-mode IC according to a third embodiment of the present invention.
Figure 14:
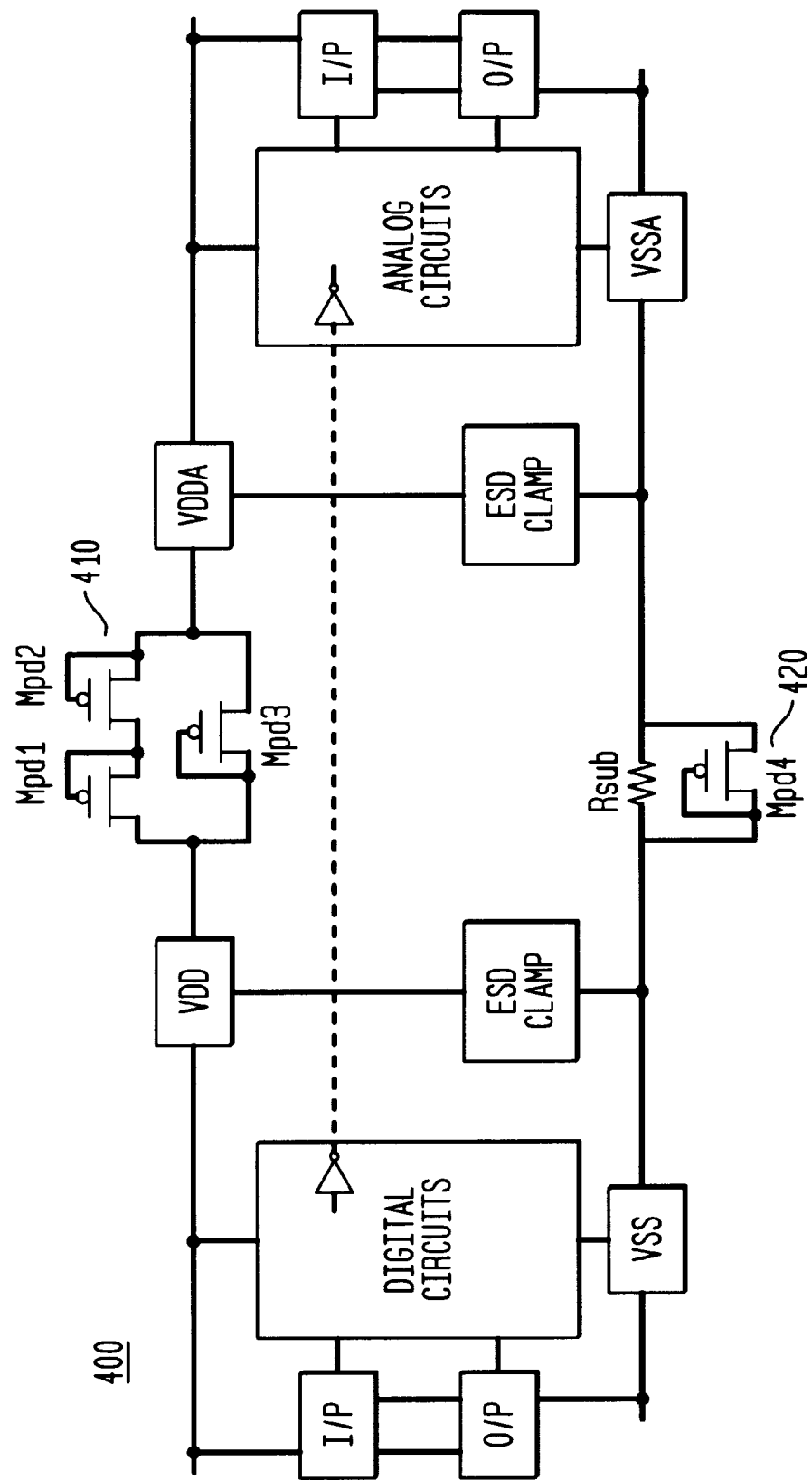
FIG. 14 shows an ESD protected mixed-mode IC according to a fourth embodiment of the present invention.

As further shown in FIG. 9, as well as in FIGS. 12–14 described hereinlater, an I/P block and an O/P block are coupled to each internal circuit 110, 120. Further, each I/P block and each O/P block is connected between the VDD (or VDDA) and the VSS (or VSSA) power supply busses. Each I/P block includes an input pad and an input ESD protection circuit, where the input ESD protection circuit comprises a pair of input diodes (not shown in FIG. 9). In addition, each O/P block includes an output pad and an output buffer (not shown in FIG. 9). FIG. 11 illustrates an input pad 161, input ESD protection circuit 150, output pad 162, and output buffer 163, which is described in detail with reference to FIG. 11 below.

One or more ESD protection circuits 140, 142 are also provided. The ESD protection circuit 140 is connected between the VDD and VDDA power supply busses 132 and 136. The ESD protection circuit 142 is connected between the VSS and VSSA power supply busses 134 and 138. As shown, each of the ESD protection circuits 140 or 142 includes diodes. For instance, ESD protection circuit 140 includes a series connection of diodes D1 and D2 connected in parallel with the diode D3. The anode of diode D1 is connected to the VDD power supply bus 132. The anode of diode D2 is connected to the cathode of D1. The cathode of diode D2 is connected to the VDDA power supply bus. The anode of diode D3 is connected to the VDDA power supply bus and the cathode of diode D3 is connected to the VDD power supply bus 132. The ESD protection circuit 142 is shown including only a single diode D4 having its anode connected to the VSSA power supply bus and its cathode connected to the VS3 power supply bus 134.

The series connection of diodes D1 and D2 are forward biased when the voltage of the VDD power supply bus 132 exceeds the voltage of the VDDA power supply bus 136 by the combined turn-on threshold voltage of D1 and D2. Likewise, the diode D3 is forward biased when the voltage of the VDDA power supply bus 136 exceeds the voltage of the VDD power supply bus 132 by the turn-on threshold of D3. In this design, the voltages of the VDD and VDDA power supply busses 132 and 136 are presumed to be close, to each other, except during an ESD event (as described below). During ordinary operation, the noise on the VDD or VDDA power supply busses 132 and 136 must exceed the appropriate turn-on threshold in order to significantly couple between the two busses. Otherwise, the noise is blocked and the two busses 132 and 136 remain isolated. (Note that the architecture of FIG. 9 presumes that coupling of noise from the VDD power supply bus 132 to the VDDA power supply bus 136 is a more significant problem. Therefore, more diodes D1 and D2 are provided in the forward path from the VDD power supply bus 132 to the VDDA power supply bus 136.) In a high noise application, the number of diodes can be increased to reduce the likelihood that noise with couple between the two busses 132 and 136. A similar property applies to VSS and VSSA.

Figure 10:
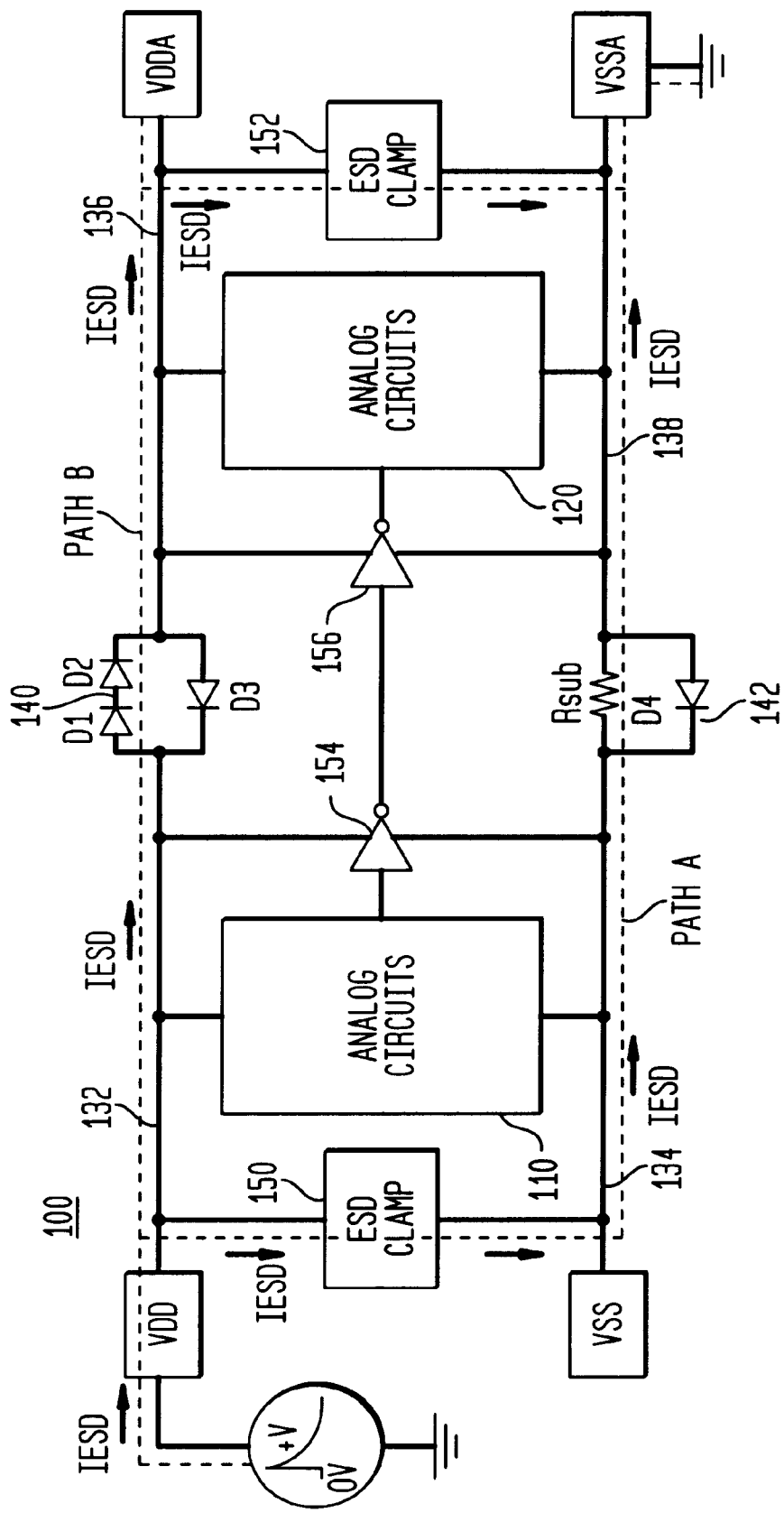
FIGS. 10–11 show an ESD protected operation of the IC of FIG. 9.

FIG. 10 illustrates the protection function of the ESD protection circuits 140 and 142 in a VDD-to-VSS ESD stress scenario. In FIG. 10, a positive ESD voltage is applied to the VDD pin with the VSSA pin relatively grounded. In such an ESD-stress condition, the ESD current at the VDD power supply bus 132 might couple across the VDD-to-VSS ESD protection circuit 150 to the VSS power supply bus 134. The ESD current then couples across the resistance of p-substrate Rsub to the VSSA power supply bus 138. Then, the ESD current flows to ground through the VSSA pin. Such a discharging path is marked as the path A in FIG. 10.

The inherent substrate resistor Rsub between the VSS power supply bus 134 and the VSSA power supply bus 138 may slow down the discharging of the ESD current through the path A too much to prevent ESD failure. However, another discharge path B is provided for ESD current. When the positive ESD voltage appears on the VDD pin with the VSSA pin grounded, the ESD current is coupled from the VDD power supply bus 132 across the diodes D1 and D2 to the VDDA power supply bus 136. Then, the ESD current is coupled by the ESD protection circuit 152 from the VDDA power supply bus 136 to the VSSA power supply bus 138. The ESD current is then coupled to ground. The desired path B does not contain the resistance Rsub and therefore discharges the ESD current more quickly, thereby preventing damage to the interface circuits 154 and 156.

Likewise, if the ESD voltage is applied to the VDDA power supply bus 136 with the VSS power supply bus 134 relatively grounded, the ESD current can be coupled across the diode D3 to the VDD power supply bus 132. Then the ESD current is coupled across the ESD protection circuit 150 to the VSS power supply bus 134. Alternatively, the ESD current may be coupled across the ESD protection circuit 152 from the VDDA power supply bus 136 to the VSSA power supply bus 138. The ESD current couples across the diode D4 to the VSS power supply bus 134. Finally, the ESD current is discharged to ground via the VSS pin. Thus, the diodes of the ESD protection circuits 140 and 142 provide effective ESD protection to the mixed-mode IC 100.

FIG. 11 illustrates the ESD protection function in a pin-to-pin ESD stress scenario. For example, the ESD voltage may be applied to a digital input pad 161 with an analog output pad 162 relatively grounded, but all the other pins left floating. An ESD current is first coupled to the VDD power supply bus 132 by the diode Dp1 in the digital input ESD protection circuit 150. The ESD current is then coupled by the diodes D1 and D2 of the ESD protection circuit 140 to the VDDA power supply bus 136. The ESD current on the VDDA power supply bus is coupled by the ESD protection circuit 152 to thee VSSA power supply bus 138. Because the analog output pad 162 is grounded, a parasitic diode Dn5 in the NMOS FET Mn5 of the output driver for the output pad 162 is forward biased. The parasitic diode Dn5 conducts the ESD current to the output pad 162 and therefore to ground. This ESD discharging path is shown by the dashed line in FIG. 11. Note that the discharge path avoids the inverters 154 and 156 thereby avoiding ESD damage thereto.

Thus, the proposed ESD protected circuit includes diodes for connecting the isolated VDD and VDDA or VSS and VSSA power supply busses of the same polarity during an ESD event. Since no current is coupled unless the diodes are forward biased (i.e., the voltage difference between the two isolated power supply busses exceeds the forward bias voltage of the series connection of diodes in the forward path), the two power supply busses (e.g., VDD and VDDA) remain isolated and little noise couples between the two busses.

The proposed ESD protection concept can be implemented in an IC with more than two isolated power supply busses of the same polarity. For example, FIG. 12 shows an IC 200 with three internal circuits 211, 212 and 213. Each internal circuit 211–213 has its own high VDD1, VDD2, VDD3 and low VSS1, VSS2, VSS3 power supply busses (VDD1 221, VSS1 231) (VDD2 222, SS2 232) or (VDD3 223, VSS3 233). The interface circuits between the internal circuits 211–213 are vulnerable to the pin-to-pin and the VDD-to-VSS ESD stresses. ESD protection circuits 241, 242, 251 and 252, including diodes (D11, D12, D13, D14), (D21, D22, D23, D24), (D15, D16) and (D25, D26), respectively are therefore provided. The ESD protection circuit 241 is connected between the VDD1 and VDD2 power supply busses 221 and 222. The ESD protection circuit 242 is connected between the VDD2 and VDD3 power supply busses 222 and 223. The ESD protection circuit 251 is connected between the VSS1 and VSS2 power supply busses 231 and 232. The ESD protection circuit 252 is connected between the VSS2 and VSS3 power supply busses 232 and 233. Note that the number of diodes in each ESD protection circuit 241, 242, 251 or 252 can be individually adjusted to achieve the requisite noise coupling margin.

FIGS. 13 and 14 show ESD protection circuits 300 and 400 according to alternative embodiments. In the ESD protected circuit 300 of FIG. 13, the diodes of the ESD protection circuits 310 and 320 are replaced with diode connected NMOS FETs. In FIG. 14, the diodes of the ESD protected circuits 410 and 420 are replaced with diode connected PMOS FETs. The operation of these embodiments is similar to that described above.

The above discussion is intended to be merely illustrative of the invention. Those having ordinary skill in the art may devise numerous alternative embodiments without departing from the spirit and scope of the following claims.

What is claimed is:

1. An integrated circuit, for protecting first and second internal circuits, respectively connected to either a first or a second power supply bus, against ESD failure, said first and second power supply busses being mutually isolated from each other and being of the same polarity, and said first and second internal circuits being respectively connected to either a third or a fourth power supply bus, said third and fourth power supply busses being mutually isolated from each other, of the same polarity but of opposite polarity as said first and second power supply busses, said integrated circuit comprising:

a first I/P block including a first input pad and a first input ESD protection circuit, said first input ESD protection circuit comprising first and second input diodes, said first and second input diodes being connected in series between said first and third power supply busses and being connected in parallel to said first input pad;

a second I/P block including a second input pad and a second input ESD protection circuit said second input ESD protection circuit comprising third and fourth input diodes, said third and fourth input diodes being connected in series between said second and fourth power supply busses and being connected in parallel to said second input pad;

a first O/P block including a first output pad and a first output buffer, said first output buffer being connected between said first and third power supply busses and being connected to said first output pad;

a second O/P block including a second output pad and a second output buffer, said second output buffer being connected between said second and fourth power supply busses and being connected to said second output pad;

a first interface circuit being connected to said first internal circuit and to said first and third power supply busses;

a second interface circuit being connected to said second internal circuit, to said second and fourth power supply busses, and to said first interface circuit, such that signals may pass between said first and second internal circuits;

a first ESD protection circuit connected to said first and third power supply busses, a second ESD protection circuit connected to said second and fourth power supply busses, a third ESD protection circuit connected between said first and second power supply busses for selectively connecting said first and second power supply busses only during an ESD event so that ESD energy applied to one of said first or second power supply busses couples to a second one of said first or second power supply busses, said third ESD protection circuit comprising at least first and second diodes connected in series, said at least first and second diodes being connected in parallel with at least third and fourth diodes connected in series, a fourth ESD protection circuit connected between said third and fourth power supply busses for selectively connecting said third and fourth power supply busses during an ESD event so that ESD energy applied to one of said third or fourth power supply busses couples to a second one of said third or fourth power supply busses, said fourth ESD protection circuit comprising a resistor in parallel with a fifth diode which is in parallel with a sixth diode, and wherein said ESD energy coupled between said first and second power supply busses and between said third and fourth power supply busses is also coupled through at least one of said first or second ESD protection circuits to ground.

2. The integrated circuit of claim 1, wherein a turn-on voltage of any of said diodes exceeds an expected noise threshold on one of said first or second power supply busses.

3. The integrated circuit of claim 1, wherein said third ESD protection circuit being configured such that the anode of said first diode being connected to said first power supply bus, the anode of said second diode being connected to the cathode of said first diode, the cathode of said second diode being connected said second power supply bus, the anode of said third diode being connected to said second power supply bus, the cathode of said third diode being connected to the anode of said fourth diode, and the cathode of said fourth diode being connected to said first power supply bus.

4. The integrated circuit of claim 1, wherein said fourth ESD protection circuit being configured such that the anode of said fifth diode being connected to said fourth power supply bus, the cathode of said fourth diode being connected to said third power supply bus, the anode of said sixth diode being connected to said third power supply bus, and the cathode of said sixth diode being connected to said fourth power supply bus.

5. The integrated circuit of claim 1, wherein said first and second interface circuits are first and second invertors, respectively.

6. An integrated circuit, for protecting first and second internal circuits, respectively connected to either a first or a second power supply bus, against ESD failure, said first and second power supply busses being mutually isolated from each other and being of the same polarity, and respectively connected to either a third or a fourth power supply bus, said third and fourth power supply busses being mutually isolated from each other, of the same polarity but of opposite polarity as said first and second power supply busses, comprising:

a first I/P block including a first input pad and a first input ESD protection circuit, said first input ESD protection circuit comprising first and second input diodes, said first and second input diodes being connected in series between said first and third power supply busses and being connected in parallel to said first input pad;

a second I/P block including a second input pad and a second input ESD protection circuit, said second input ESD protection circuit comprising third and fourth input diodes, said third and fourth input diodes being connected in series between said second and fourth power supply busses and being connected in parallel to said second input pad;

a first O/P block including a first output pad and a first output buffer, said first output buffer being connected between said first and third power supply busses and being connected to said first output pad;

a second O/P block including a second output pad and a second output buffer, said second output buffer being connected between said second and fourth power supply busses and being connected to said second output pad;

a first interface circuit being connected to said first internal circuit and to said first and third power supply busses;

a second interface circuit being connected to said second internal circuit, to said second and fourth power supply busses, and to said first interface circuit, such that signals may pass between said first and second internal circuits;

a first ESD protection circuit connected to said first and third power supply busses, a second ESD protection circuit connected to said second and fourth power supply busses, a third ESD protection circuit connected between said first and second power supply busses for selectively connecting said first and second power supply busses only during an ESD event so that ESD energy applied to one of said first or second power supply busses couples to a second one of said first or second power supply busses, said third ESD protection circuit comprising first and second MOS FETs connected together in series and connected in parallel with a third MOS FET, and a fourth ESD protection circuit connected between said third and fourth power supply busses for selectively connecting said third and fourth power supply busses during an ESD event so that ESD energy applied to one of said third or fourth power supply busses couples to a second one of said third or fourth power supply busses, said fourth ESD protection circuit comprising a resistor in parallel with a fourth MOS FET, wherein said ESD energy coupled between said first and second power supply busses and between said third and fourth power supply busses is also coupled through at least one of said first or second ESD protection circuits to ground.

7. The integrated circuit of claim 6, wherein the MOS FETs of said third and fourth ESD protection circuits being p-type.

8. The integrated circuit of claim 6, wherein the MOS FETs of said third and fourth ESD protection circuits being n-type.

9. The integrated circuit of claim 6, wherein said first and second interface circuits are first and second invertors, respectively.

* * * * *